(12) United States Patent
Kito et al.

(10) Patent No.: US 7,439,533 B2
(45) Date of Patent: Oct. 21, 2008

(54) OPTICAL MODULE AND OPTICAL COMMUNICATION DEVICE

(75) Inventors: Satoshi Kito, Suwa (JP); Akira Miyamae, Fujimi-machi (JP); Kimio Nagasaka, Hokuto (JP)

(73) Assignee: Seiko Epson Corporation (JP)

(*) Notice: Subject to any disclaimer, the term of this patent is extended or adjusted under 35 U.S.C. 154(b) by 88 days.

(21) Appl. No.: 11/551,742

(22) Filed: Oct. 23, 2006

(65) Prior Publication Data
US 2007/0170348 A1    Jul. 26, 2007

(30) Foreign Application Priority Data
Jun. 20, 2006    (JP) ............... 2006-170463

(51) Int. Cl.
    H01L 31/14    (2006.01)
    H04B 10/12    (2006.01)
(52) U.S. Cl. ............... 250/552; 250/214 C; 398/197; 398/200; 398/201; 385/93; 372/29.021
(58) Field of Classification Search ............... 250/205, 250/214 C, 552; 372/29.014, 29.02, 29.021, 372/31, 29.011, 38.01, 38.04, 38.07; 398/192, 398/195, 197, 200, 201; 385/93
See application file for complete search history.

(56) References Cited

U.S. PATENT DOCUMENTS

| | | | |
|---|---|---|---|
| 4,238,707 A * | 12/1980 | Malissin et al. | ............. 315/175 |
| 6,526,078 B2 * | 2/2003 | Lee | ............... 372/31 |
| 6,595,701 B2 * | 7/2003 | Terada et al. | ............. 385/93 |
| 6,876,685 B2 * | 4/2005 | Umemoto et al. | ........ 372/43.01 |
| 6,885,443 B2 * | 4/2005 | Schrodinger | ............. 356/218 |
| 6,921,921 B2 * | 7/2005 | Sato | ............... 257/81 |
| 7,075,117 B2 * | 7/2006 | Yamada | ............... 257/98 |

FOREIGN PATENT DOCUMENTS

| | | |
|---|---|---|
| JP | 06-005916 | 1/1994 |
| JP | 10-65189 | 3/1998 |
| JP | 2002-182076 | 6/2002 |
| JP | 2003-318488 | 11/2003 |
| JP | 2004-72072 | 3/2004 |
| JP | 2004-214311 | 7/2004 |

* cited by examiner

*Primary Examiner*—Stephen Yam
(74) *Attorney, Agent, or Firm*—Harness, Dickey & Pierce, P.L.C.

(57) ABSTRACT

An optical module includes a light emitting element, a connector part that supports one end of an optical fiber and optically couples the optical fiber to the light emitting element, and a monitoring light receiving element that has a characteristic to increase photosensitivity with an increase in an ambient temperature, and receives a part of components of light emitted from the light emitting element.

13 Claims, 8 Drawing Sheets

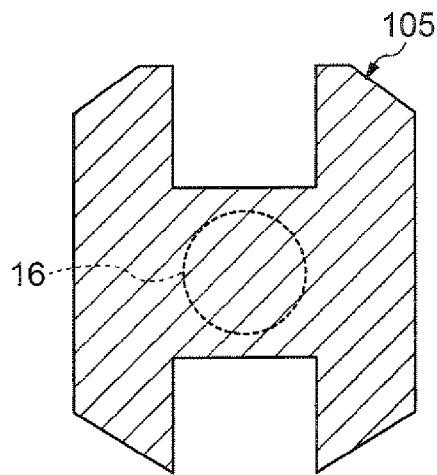
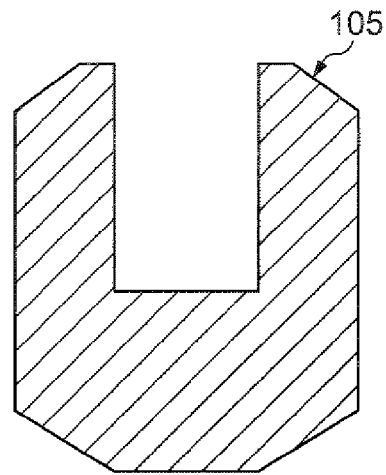
FIG.16A    FIG.16B
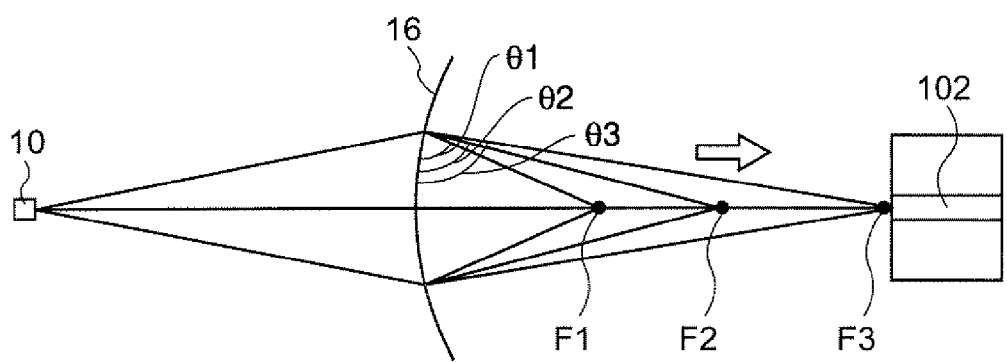
FIG.17

OPTICAL MODULE AND OPTICAL COMMUNICATION DEVICE

The entire disclosure of Japanese Patent Application Nos. 2005-331985, filed Nov. 16, 2005, 2005-331989, filed Nov. 16, 2005 and 2006-170463, filed Jun. 20, 2006 are expressly incorporated by reference herein.

BACKGROUND

1. Technical Field

The present invention relates to optical modules and optical communications devices that are used for optical communications.

2. Related Art

A variety of modes of optical modules are known. One of them is an optical module having a structure in which a part of light emitted from a light emitting element is received by a monitoring light receiving element, thereby monitoring the amount of the light. This type of optical module performs feedback control of a driving current for the optical element based on a current outputted from the monitoring light receiving element according to the amount of received light, which makes it possible to maintain the amount of light emitted from the light emitting element constant without regard to changes in the surrounding environment or deterioration of the optical element with the laps of time. In particular, when a vertical cavity surface emitting laser (VSCEL) whose light emission amount greatly changes according to the ambient temperature is used as a light emitting element, a feedback control (APC: automatic power control) to increase the driving current with an increase in the ambient temperature becomes more important in order to maintain the amount of light emission constant. In this instance, it is desirous as an ideal condition that the amount of light emitted from a light emitting element and coupled to an optical fiber through, for example, a lens or the like (the amount of light coupled with the fiber) is proportional to the amount of light received by a monitoring light receiving element (the amount of light monitored). For this reason, the temperature characteristics of the respective members such as the monitoring light receiving element, the lens and the like are reduced as much as possible such that the proportional relation between the amount of light monitored and the amount of light coupled to the fiber can be maintained. In this connection, examples of related art are described in Japanese Laid-open Patent Applications JP-A-2004-72072 and JP-A-10-65189.

However, even when the temperature characteristics of the respective member are suppressed, the emission angle of emission light of the VCSEL changes according to the ambient temperature, which causes a phenomenon in which the amount of light incident upon the monitoring light receiving element reduces with an elevation of the ambient temperature. As a solution to this phenomenon, for example, the area of the light receiving section of the monitoring light receiving element may be made sufficiently large. However, such a measure has a limitation due to restrictions on mounting, and is contradictory to the demand for miniaturization of optical modules.

Also, when the feedback control (APC) described above is performed, the operational temperature range of the optical module depends on characteristics of the light emitting element. Concretely, the light output of the light emitting element such as a VCSEL lowers as the ambient temperature becomes higher, such that, if its light output is set too high at room temperature (for example, about 25° C.), its light output cannot be maintained, when the ambient temperature rises, at the same level as the level at room temperature. In contrast, if the light output is set to a relatively low level at room temperature, the desired light output can be secured even when the ambient temperature rises, whereby the operational temperature range of the optical module can be widened. However, when the light output is set to a relatively low level, the waveform quality of optical signal at the time of high-speed modulation driving of the light emitting element may be deteriorated. This problem becomes more conspicuous as the ambient temperature lowers. Accordingly, in reality, the light output cannot be set to a level that is too low. In other words, the operational temperature range of the optical module cannot be widened.

In this respect, in order to widen the operational temperature range of an optical module, a variety of methods, such as, a method to improve the temperature characteristic of a light emitting element itself a method to provide a system to maintain constant the temperature of a light emitting element itself and the like, are considered. However, the element structure may require a complex design in order to improve the temperature characteristic of a light emitting element and to realize high-speed modulation. For example, related art is described in Japanese Laid-open Patent Applications JP-A-6-5916 and JP-A-2004-214311. Furthermore, in order to maintain the temperature of a light emitting element itself constant, a mechanism, such as, for example, a heat sink or the like may be needed (for example, see Japanese Laid-open Patent Application JP-A-2003-318488). However, such a method causes problems, such as, an increased number of components of the optical module, violation of the demand for miniaturization of the optical module, and the like.

SUMMARY

In accordance with an advantage of some aspects of the invention, there can be provided optical modules whose operational temperature range can be widened without complicating their structure.

(1) In accordance with an embodiment of the invention, an optical module includes: a light emitting element; a connector part that supports one end of an optical fiber and optically couples the optical fiber to the light emitting element; and a monitoring light receiving element that has a characteristic to increase photosensitivity with an increase in ambient temperature (in other words, a positive temperature characteristic), and receives a part of components of light emitted from the light emitting element. It is noted that the "ambient temperature" means surrounding temperature around the optical module.

According to this structure, the operational temperature range of the optical module can be widened without complicating its structure.

Preferably, the optical module may further include a semitransparent plate that is disposed between the light emitting element and the connector part, wherein the monitoring light receiving element receives reflection light from the semitransparent plate as the part of components of light.

With this structure, monitored light that is necessary for feedback control can be readily obtained.

In accordance with an aspect of the embodiment of the invention, the optical module may further include a lens that has a characteristic to reduce its refractive index with an increase in the ambient temperature, and is disposed between the light emitting element and the semitransparent plate, wherein the mutual distance between the light emitting element and the lens may be set such that a focal position of the lens when the ambient temperature is a predetermined temperature higher than room temperature concurs with one end of the optical fiber. More specifically, the predetermined temperature higher than room temperature may be set to, for example, an upper limit of the operational range of the optical module. It is noted that the "room temperature" is generally 25° C.

According to the structure described above, changes in the amount of light to be coupled to the optical fiber, which may be caused by changes in the ambient temperature, can be suppressed.

(2) In accordance with another embodiment of the invention, an optical module includes: a light emitting element having an end face that emits a laser beam; a lens that focuses the laser beam to a focal point and has an input side main plane and an output side main plane; an optical fiber that has an end section for receiving the laser beam focused by the lens and outputs the laser beam received outside the optical module; and a supporting member that supports the light emitting element, the lens and the optical fiber, and secures an input side distance between the end section of the light emitting element and the input side main plane of the lens and an output side distance between the output side main plane of the lens and the optical fiber, wherein the supporting member positions a focal point of the lens to a first position that is spaced a distance from the end face of the optical fiber when the optical module is at a first temperature, and positions the focal point of the lens to a second position that is closer to the end face of the optical fiber than the first position when the optical module is at a second temperature higher than the first temperature.

According to the structure described above, the operable temperature range of the optical module can be widened without complicating its structure. Also, a reduction in the optical coupling efficiency can be suppressed.

Preferably, the refractive index of the lens may be smaller at the second temperature than at the first temperature.

According to the structure described above, by utilizing changes in the refractive index of the lens, a reduction in the optical coupling efficiency can be suppressed.

Preferably, the distance between the output side main plane of the lens and the second position may be greater than the distance between the output side main plane of the lens and the first position.

According to this structure, even when the distance (focal point) changes, a reduction in the optical coupling efficiency can be suppressed.

(3) In accordance with another embodiment of the invention, an optical module includes: a light emitting element; a connector part that supports one end of an optical fiber and optically couples the optical fiber to the light emitting element; a semitransparent plate that has a characteristic to reduce its transmittance with an increase in an ambient temperature (a negative temperature characteristic) and is disposed between the light emitting element and the connector part; and a monitoring light receiving element that receives reflected light caused by the semitransparent plate. It is noted that the "ambient temperature" means surrounding temperature around the optical module.

According to the structure described above, the drivable temperature range of the optical module can be widened without complicating its structure.

In accordance with another embodiment of the invention, an optical module includes: a light emitting element; a connector part that supports one end of an optical fiber and optically couples the optical fiber to the light emitting element; a semitransparent plate that has a characteristic to increase its transmittance with an increase in an ambient temperature (a positive temperature characteristic) and is disposed between the light emitting element and the connector part; and a monitoring light receiving element that has a characteristic to increase its transmittance with an increase in the ambient temperature (a positive temperature characteristic) and receives reflected light caused by the semitransparent plate.

According to the structure described above, the drivable temperature range of the optical module can be widened without complicating its structure.

Preferably, the semitransparent plate may include a transparent substrate and a dielectric multilayered film formed on one surface of the transparent substrate.

By this, a semitransparent plate having a negative temperature characteristic with respect to the transmittance can be readily realized.

Preferably, the optical module may further include a lens that has a characteristic to reduce its refractive index with an increase in the ambient temperature, and is disposed between the light emitting element and the semitransparent plate, wherein the mutual distance between the light emitting element and the lens may be set such that a focal position of the lens, when the ambient temperature is a predetermined temperature higher than room temperatures concurs with one end of the optical fiber. More specifically, the predetermined temperature higher than room temperature may be, for example, an upper limit of the operational range of the optical module. It is noted that the "room temperature" is generally 25° C.

According to the structure described above, changes in the amount of light to be coupled to the optical fiber, which may be caused by changes in the ambient temperature, can be suppressed.

(5) In accordance with another embodiment of the invention, an optical module includes: a light emitting element; a connector part that supports one end of an optical fiber and optically couples the optical fiber to the light emitting element; a lens that has a characteristic to reduce its refractive index with an increase in the ambient temperature, and is disposed between the light emitting element and the connector part; a reflection surface disposed between the light emitting element and the connector part; and a monitoring light receiving element that has a characteristic to increase its photosensitivity with an increase in the ambient temperature, and receives reflected light of light emitted from the light emitting element reflected by the reflection surface, wherein the lens has a focal point of light emitted from the light emitting element at a first position that is spaced a distance from an end face of the optical fiber at a first temperature, and at a second position that is closer to the end face of the optical fiber than the first position at a second temperature higher than the first temperature.

According to the structure described above, the drivable temperature range of the optical module can be widened without complicating its structure.

Preferably, the lens may be disposed closer to the light emitting element than to the reflection surface.

By this structure, a certain distance can be secured between the light emitting element and the reflection surface, and the monitoring light receiving element and the light emitting element can be disposed separated from each other.

(6) In accordance with another embodiment of the invention, an optical communications device (an optical transceiver) is equipped with one of the optical modules described above More concretely, the optical communications device in accordance with an aspect of the present embodiment is equipped with one of the optical modules described above, and a circuit section that supply driving signals to the optical module.

According to this structure, a high performance optical communications device with a wide drivable temperature range can be obtained.

BRIEF DESCRIPTION OF THE DRAWINGS

FIGS. 16A and 16B are cross-sectional views for describing structures of optical modules in accordance with Embodiment 4.

FIG. 17 is a schematic diagram showing the relation between ambient temperatures at the time of driving and focal points of a lens.

DESCRIPTION OF EXEMPLARY EMBODIMENTS

Embodiments of the invention are described below with reference to the accompanying drawings.

Embodiment 1

Figure 1:
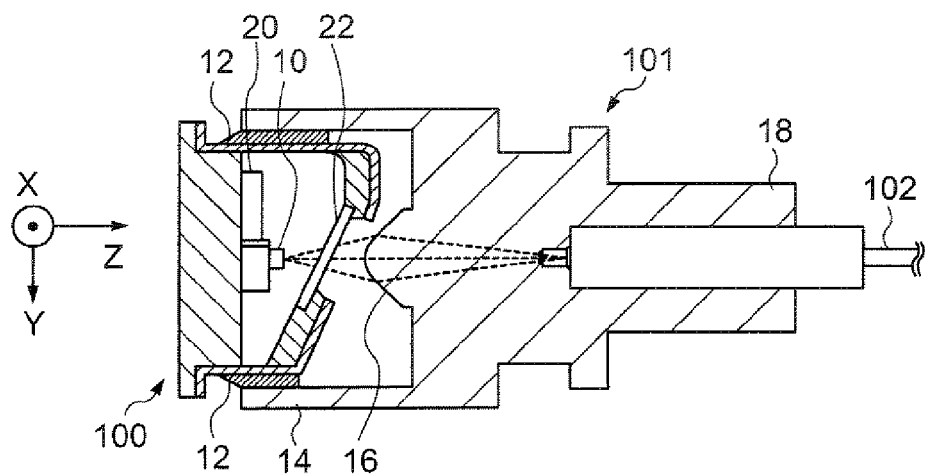
FIG. 1 is a cross-sectional view for describing the structure of an optical module in accordance with Embodiment 1 of the invention.

FIG. 1 is a cross-sectional view for describing the structure of an optical module in accordance with an embodiment of the invention. The optical module of the present embodiment is formed from a can package 100 and a connector part 101 positioned with each other, which are affixed with each other with an adhesive 12. The connector part 101 supports one end of an optical fiber 102, and optically couples the optical fiber 102 to a light emitting element 10 within the can package 100.

The can package 100 is formed from a housing made of metal or the like that packages the light emitting element 10. In the present embodiment, as the light emitting element 10, a VCSEL (vertical cavity surface emitting laser) diode that emits light in multimode is considered. The light emitting element 10 emits light with a wavelength of, for example, 850 nm. Also, the can package 100 is equipped with a monitoring light receiving element 20 as a system for monitoring light output of the light emitting element 10 and a semitransparent glass plate (semitransparent plate) 22. The semitransparent glass plate 22 is disposed between the light emitting element 10 and a lens 16 in a manner that one of its surfaces is placed diagonally with respect to (in other words, in a state not to be placed perpendicularly to) an optical axis of emission light of the light emitting element 10. The semitransparent glass plate 22 is coated on its surface with an extremely thin metal film, and reflects a part of components of emission light of the light emitting element 10. The monitoring light receiving element 20 is disposed at a location at which it can receive reflected light caused by the semitransparent glass plate 22, and generates a current (hereafter referred to as a "monitored current") according to the amount of received light. The monitoring light receiving element 20 is composed of a semiconductor element, such as, for example, a photodiode, a phototransistor, or the like.

The connector part 101 is equipped with a support section 14 in a bore configuration that supports the can package 100, a lens 16 that is disposed with its optical axis matched with that of the light emitting element 10, and focuses light emitted from the light emitting element 10 and leads the light to one end of the optical fiber 102, and a sleeve section 18 with one end of the optical fiber 102 mounted and supported thereon. In the exemplary embodiment, a ferrule is mounted on one end of the optical fiber 102, and the ferrule is inserted in the sleeve section 18. It is noted that, in the exemplary embodiment, the optical fiber 102 is a GI (Graded Index) multimode fiber with an NA being 0.21, having, for example, a core diameter of 50 µm, and a clad diameter of 125 µm.

Figure 2:
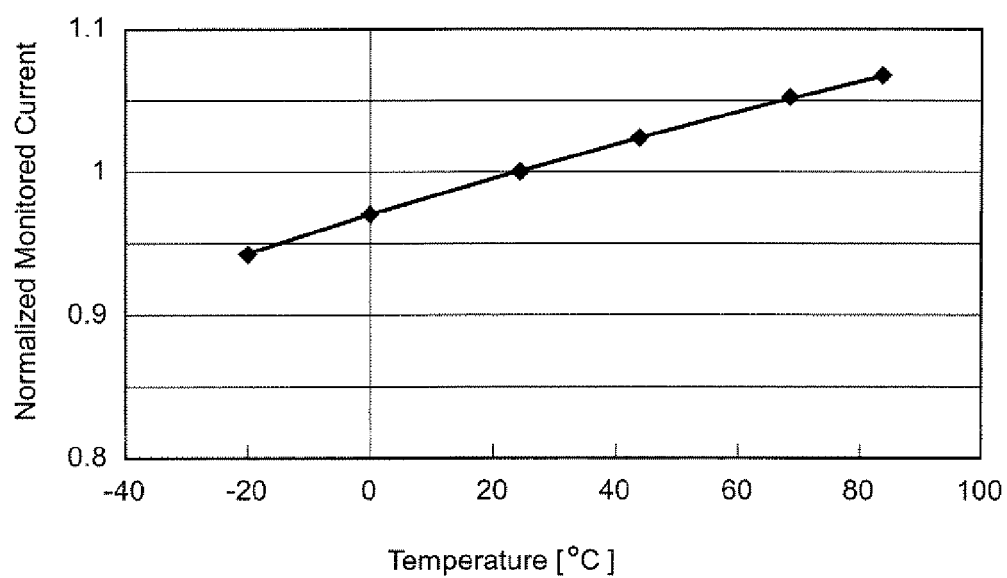
FIG. 2 is a graph indicating a temperature characteristic of monitored currents of a monitoring light receiving element.

FIG. 2 is a graph showing a temperature characteristic of monitored currents of the monitoring light receiving element. In the graph shown in FIG. 2, temperatures are indicated along the axis of abscissa and monitored currents obtained when a constant amount of light is inputted in the monitoring light receiving element 20 are indicated along the axis of ordinate. It is noted that the monitored currents are normalized based on an output value at 25° C. The monitoring light receiving element 20 in accordance with the present embodiment has a characteristic to increase its photosensitivity with an increase in the ambient temperature (in other words, has a positive temperature characteristic). For this reason, as shown in FIG. 2, even when the amount of light incident upon the light receiving face of the monitoring light receiving element 20 is constant, the monitored current increases as the ambient temperature elevates. It is noted here that the "ambient temperature" in accordance with the present embodiment means the surrounding temperature around the optical module. More concretely, the monitoring light receiving element 20 in accordance with the present embodiment has a temperature coefficient of 0.2%/° C. with respect to light with a wavelength of 850 nm. Such a temperature characteristic may be realized, for example, when the monitoring light receiving element 20 is composed of a semiconductor element as described above, by increasing the amount of impurity (the amount of doping) added to an n-type region more than normal, making the thickness of a photoabsorption layer thinner than normal, adjusting the designed wavelength of a reflection prevention coating film, or the like.

Figure 3:
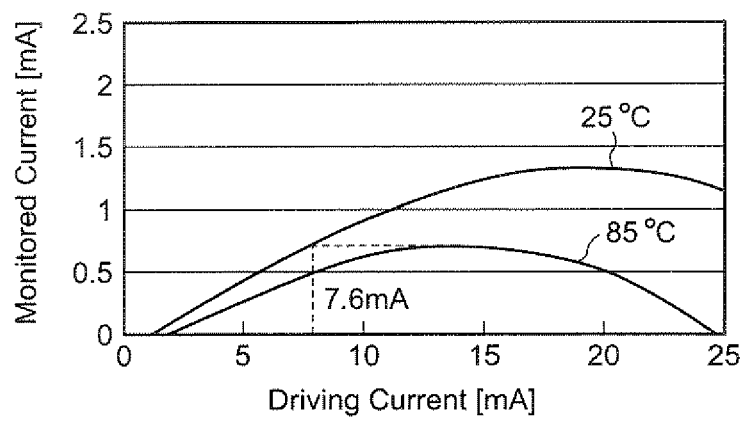
FIG. 3 is a graph showing the relation between driving currents to be supplied to an optical element of the optical module in accordance with the present embodiment and monitored currents.
Figure 4:
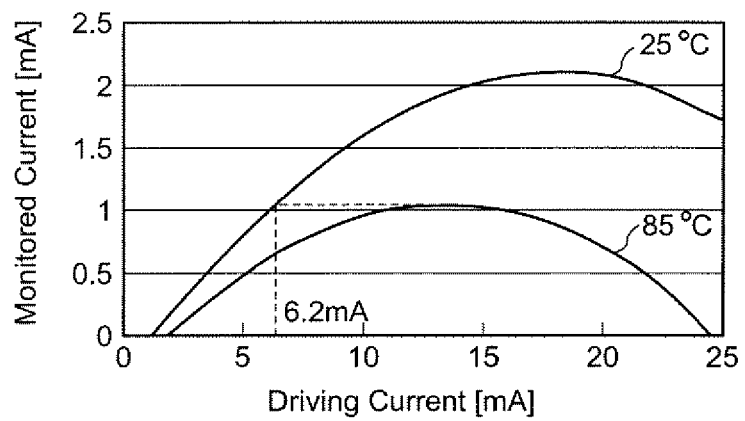
FIG. 4 is a graph showing the relation between driving currents to be supplied to an optical element of a comparison example and monitored currents.

FIG. 3 is a graph showing the relation between driving currents to be supplied to the light emitting element of the optical module in accordance with the present embodiment and monitored currents. FIG. 4 is a graph showing the relation between driving currents to be supplied to a light emitting element of an optical module of a comparison example and monitored currents. It is noted that the optical module of the comparison example has generally the same structure as that of the optical module in accordance with the present embodiment except that the optical module of the comparison example uses a monitoring light receiving element that does not have the temperature characteristic (see FIG. 1). When the optical module is to be driven in a manner that monitored currents are always at a constant value regardless of changes in the ambient temperature, values that can be set as target monitored currents in the feedback control are restricted by the maximum value of monitored current that is obtained when the ambient temperature is at the upper limit value. In the optical module in accordance with the present embodiment, as shown in FIG. 3, when monitored currents at an ambient temperature of 85° C. are set as target values in the feedback control, the driving current to be supplied to the light emitting element 10 at an ambient temperature of 25° C. is 7.6 mA. In contrast, in the optical module in accordance with the comparison example, as shown in FIG. 4, when monitored currents at an ambient temperature of 85° C. are set as target values in the feedback control, the driving current to be supplied to the light emitting element 10 at an ambient temperature of 25° C. is 6.2 mA. In other words, in the optical module in accordance with the present embodiment, its driving current (bias current) increases by 1.4 mA at an ambient temperature of 25° C., compared to the optical module of the comparison example. This means that the range of current values that can drive the light emitting element 10 in a certain temperature range is widened. In other words, the temperature range in which the light emitting element 10 can be driven is widened.

Figure 5:
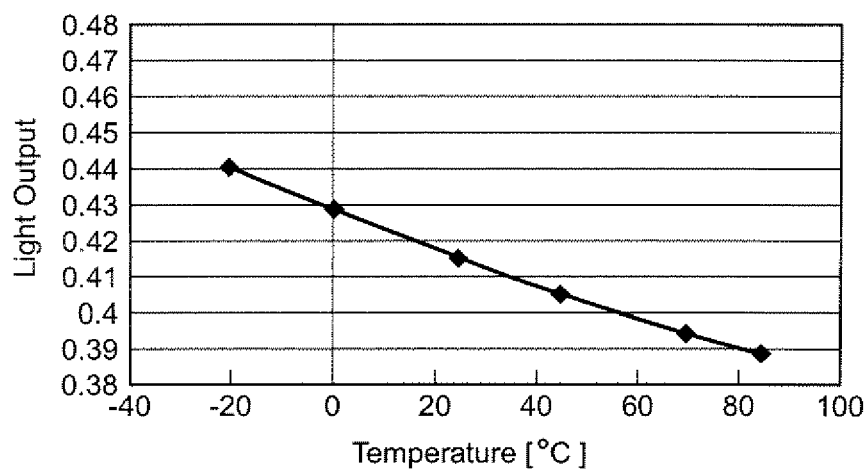
FIG. 5 is a graph showing a temperature characteristic of light outputs of a light emitting element when it is controlled to be driven such that monitored currents are maintained constant.

FIG. 5 is a graph showing a temperature characteristic of light outputs of the light emitting element (VCSEL) when it is controlled to be driven such that monitored currents are maintained constant. In the present embodiment, because the monitoring light receiving element 20 having a positive temperature characteristic is used, when the light emitting element 10 is driven in a manner that the monitored currents are maintained constant, the light output of the light emitting element 10 tends to lower with an increase in the ambient temperature, as shown in the figure. In other words, the light output of the light emitting element under the condition described above exhibits negative temperature dependency. In this respect, in the optical module in accordance with the present embodiment, the refractive index characteristic of the lens 16 is provided with temperature dependency, and a novel arrangement is implemented in the distance between the lens 16 and one end of the light emitting element 10, thereby avoiding a reduction in the optical coupling efficiency due to changes in the optical output of the light emitting element 10. The present embodiment is described below in greater detail.

Figure 6A:
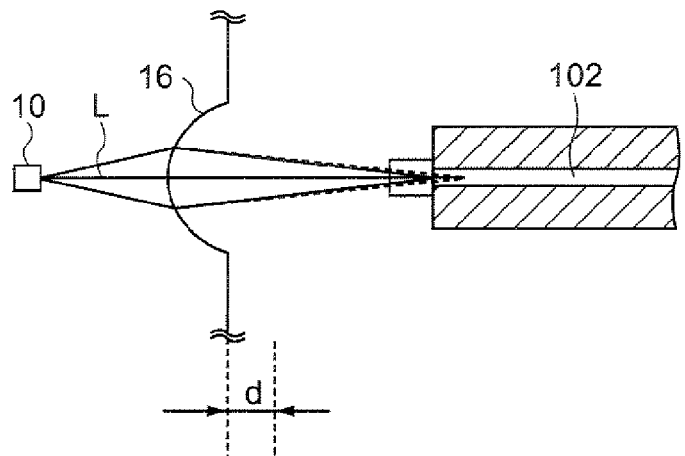
FIGS. 6A and 6B are views for describing the mutual distance between a lens and a light emitting element.
Figure 6B:
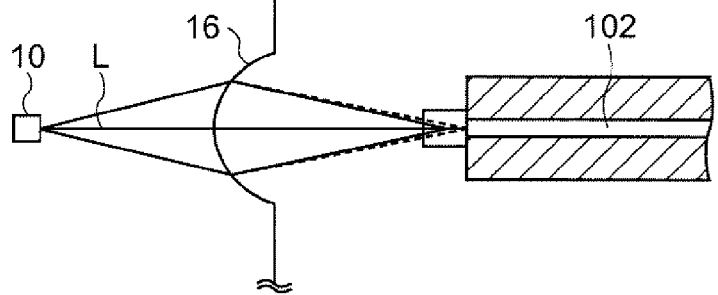

FIGS. 6A and 6B are views for describing the mutual distance between the lens and one end of the light emitting element. FIGS. 6A and 6B schematically illustrate a light beam (having an optical axis L) emitted from the light emitting element 10, passing through the lens 16 and reaching one end of the optical fiber 102. It this example, the lens 16 may be formed with resin, and has a characteristic to reduce its refractive index with an increase in the ambient temperature. More concretely, the lens 16 of the present embodiment has a refractive index of about 1.64 at 25° C., and has temperature dependency of $-1.9 \times 10^{-4}$ (1/° C.). FIG. 6A and FIG. 6B indicate a light beam in a solid line at an ambient temperature of 25° C., and a light beam in a dotted line at an ambient temperature of 85° C. It is noted that the upper limit of the range in which the optical module of the present embodiment can be operated (operation range) is 85° C.

Figure 7:
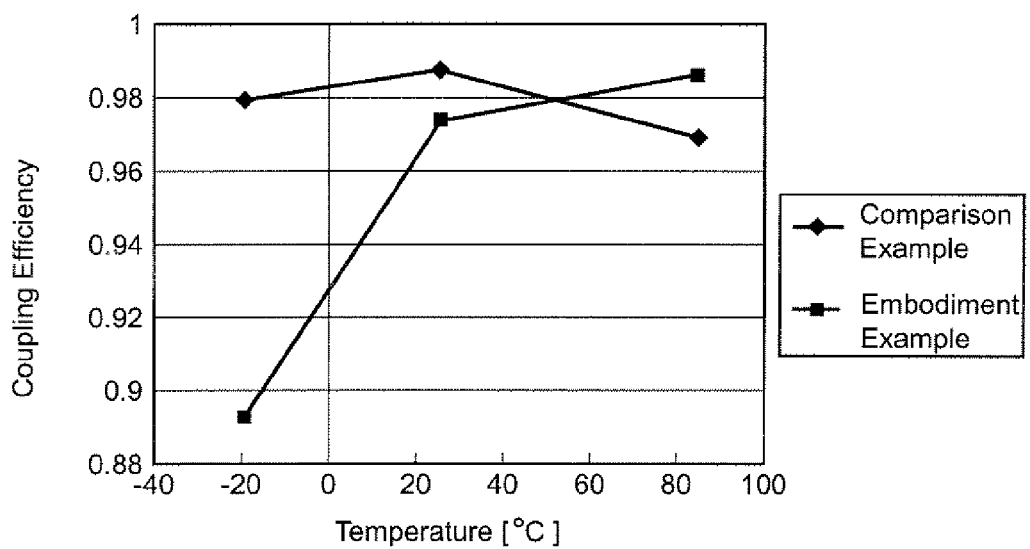
FIG. 7 is a graph for describing the optical coupling efficiency.

FIG. 6A shows a case in which one end of the optical fiber 102 is disposed at a focal point of the lens 16 at an ambient temperature of 25° C. In this case, the optical coupling efficiency in coupling light to the optical fiber 102 at the ambient temperature of 25° C. (room temperature) becomes the highest, and when the ambient temperature is lower or higher than 25° C., the optical coupling efficiency becomes lower. This phenomenon is shown in a graph (Comparison Example) in FIG. 7. In contrast, FIG. 6B shows a case in which one end of the optical fiber 102 is disposed at a focal point of the lens 16 at an ambient temperature of 85° C. More specifically, the emission end of the light emitting element 10 is disposed at a position shifted in a direction along the optical axis L by a distance d away from its position at the ambient temperature of 25° C. In other words, the mutual distance between the light emitting element 10 and the lens 16 is set such that the focal position of the lens 16, when the ambient temperature is at a predetermined temperature (e.g., the upper limit of the operational range of the optical module in the present example, which is 85° C.) higher than 25° C. (room temperature), concurs with one end of the optical fiber 102. In this case, the optical coupling efficiency in coupling light to the optical fiber 102 at the ambient temperature of 85° C. is the highest, and the optical coupling efficiency lowers as the ambient temperature becomes lower than 85° C. This phenomenon is shown in a graph (Embodiment Example) in FIG. 7. The embodiment example shown in FIG. 7 is given when the distance d is set to 20 μm. It is noted that the emission end of the light emitting element 10 can be appropriately disposed anywhere between the position at the ambient temperature being 25° C. (shown in FIG. 6A) and the position at the ambient temperature being 85° C. (shown in FIG. 6B). In other words, in the case of the embodiment example described above, the distance d can be set in a range of $0 < d \leq 20$ μm.

In this manner, the refractive index of the lens 16 is provided with temperature dependency, and the mutual distance between the lens 16 and the light emitting element 10 is made greater, whereby positive temperature dependency can be given to the optical coupling efficiency in coupling light between the light emitting element 10 and the optical fiber 102, as shown in FIG. 7. The optical coupling efficiency property having positive temperature dependency and the light output property of the light emitting element having negative temperature dependency described above (see FIG. 5) are superposed on each other, thereby creating the light output property of the optical module. It is noted that the mutual distance between the lens 16 and the light emitting element 10 can be set to a predetermined value at the time of designing the connector part 101. Alternatively, the mutual distance between the light emitting element 10 and the lens 16 can be set to a predetermined value by using an optical fiber having a fiber core that protrudes by a specified length from an abutting face to which the ferrule mounted on the optical fiber 102 is abutted within the sleeve 18 at the time of core adjustment and assembly of the module.

Figure 8:
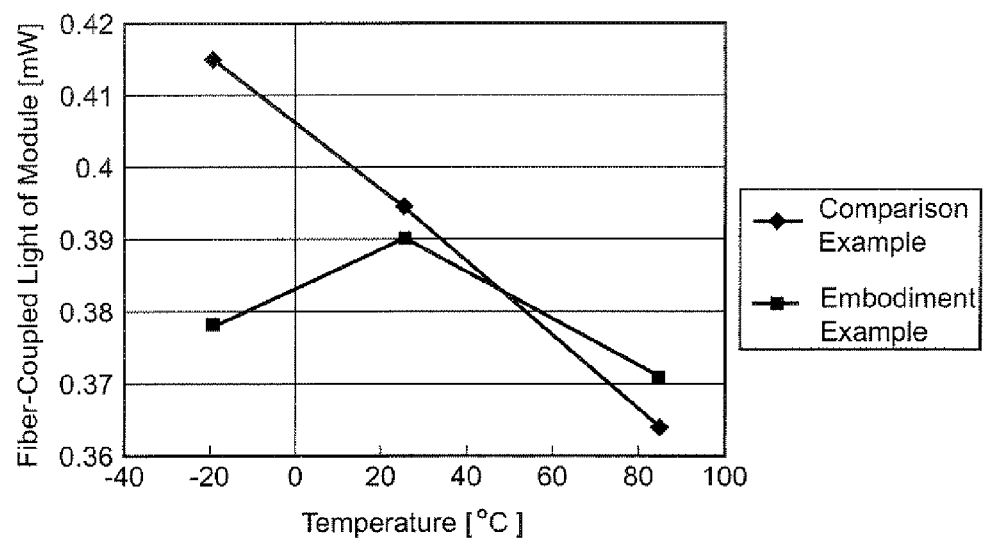
FIG. 8 is a graph showing light output characteristics of optical modules.

FIG. 8 is a graph showing light output characteristics of the optical modules. As indicated in the figure, the intensity of light coupled to the optical fiber 102 in the optical module of the comparison example lowers with an increase in the ambient temperature. On the other hand, in the optical module of the embodiment example, although there are some changes in the amount of coupled light, it is observed that changes in the light output with changes in the ambient temperature are suppressed as a whole.

According to the present embodiment described above, the drivable temperature range of an optical module can be widened without complicating the structure of the optical module. Also, by using the optical module described above, a high-performance optical communications device with a wide drivable temperature range can be obtained.

Also, in the embodiment described above, a part of components of light emitted from the light emitting element is reflected by a semitransparent glass plate and lead to the monitoring light receiving element. However, other structures may be used. According to one of the structures, a light emitting element and a monitoring light receiving element are formed in one piece, and a part of components of light emitted from the light emitting element may be directly conducted to the monitoring light receiving element.

Also, in the embodiment described above, a VCSEL is enumerated as an example of the light emitting element. However, the light emitting element in accordance with the invention is not limited to such a device. Furthermore, in the embodiment described above, a light emitting element of a can-sealed type is enumerated. However, the light emitting element in accordance with the invention is not limited to such a type.

Also, in the embodiment described above, the lens is formed in one piece with the connector part. However, the lens may be formed independently.

Embodiment 2

An optical module in accordance with Embodiment 2 is similar to Embodiment 1 (FIG. 1). More specifically, the optical module of the present embodiment is formed from a can package 100 and a connector part 101 positioned with each other, which are affixed with each other by using an adhesive 12. The connector part 101 supports one end of an optical fiber 102, and optically couples the optical fiber 102 to a light emitting element 10 within the can package 100.

The can package 100 is formed from a housing made of metal or the like that packages the light emitting element 10. In the present embodiment, as the light emitting element 10, a VCSEL that emits light in multimode is considered. The light emitting element 10 emits light with a wavelength of, for example, 850 nm. Also, the can package 100 is equipped with a monitoring light receiving element 20 as a system for monitoring light output of the light emitting element 10 and a semitransparent glass plate (semitransparent plate) 22. The semitransparent glass plate 22 is disposed between the light emitting element 10 and the connector part 101, more specifically between the light emitting element 10 and a lens 16 in a manner that one of its surfaces is placed diagonally with respect to (in other words, in a state not to be placed perpendicularly to) an optical axis of emission light of the light emitting element 10. The semitransparent glass plate 22 is coated on its surface with a dielectric multilayer film, and reflects a part of components of emission light of the light emitting element 10. The semitransparent glass plate 22 of the present embodiment has a characteristic to reduce its transmittance with an increase in the ambient temperature (negative temperature characteristic). This characteristic is described below in greater detail. The monitoring light receiving element 20 is disposed at a location at which it can receive reflected light caused by the semitransparent glass plate 22, and generates a current (hereafter referred to as a "monitored current") according to the amount of received light. The monitoring light receiving element 20 is composed of a semiconductor element, such as, for example, a photodiode, a phototransistor, or the like.

The connector part 101 is equipped with a support section 14 in a bore configuration that supports the can package 100, a lens 16 that is disposed with its optical axis matched with that of the light emitting element 10, and focuses light emitted from the light emitting element 10 and leads the light to one end of the optical fiber 102, and a sleeve section 18 with one end of the optical fiber 102 mounted and supported thereon. In the present example, a ferrule is mounted on one end of the optical fiber 102, and the ferrule is inserted in the sleeve section 18. It is noted that the optical fiber 102 may be a GI (Graded Index) multimode fiber with an NA being 0.21, having, for example, a core diameter of 50 µm, and a clad diameter of 125 µm.

Figure 9:
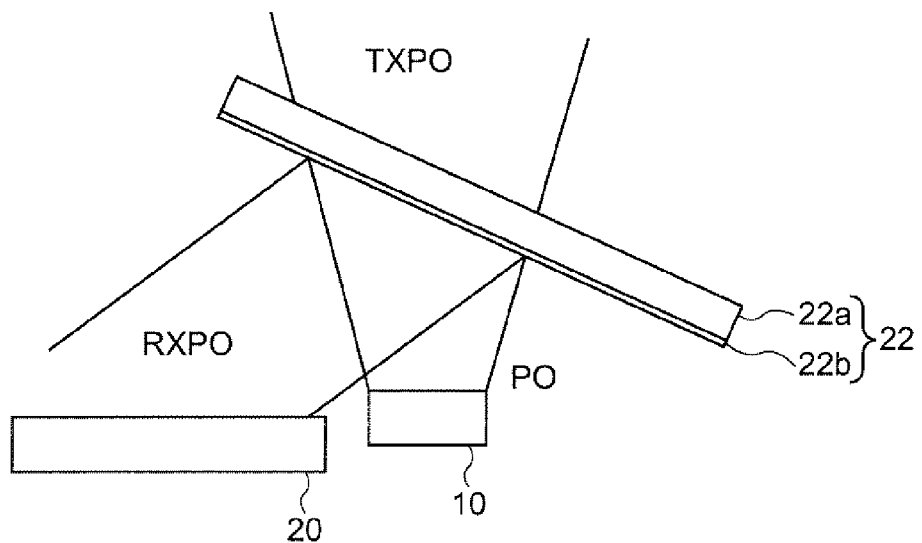
FIG. 9 is a view for further describing the relation between a light emitting element, a semitransparent glass plate and a monitoring light receiving element.

FIG. 9 is a diagram for describing the relation between the light emitting element, the semitransparent glass plate and the monitoring light receiving element. When the transmittance (power transmittance) of the semitransparent glass plate 22 is T, the reflectivity (power reflectivity) thereof is R, and absorption by the semitransparent glass plate 22 is ignored, a relation T=1−R is established. When the amount of light emitted from the light emitting element 10 is Po, the amount of light transmitting the semitransparent glass plate 22 (the amount of transmission light) can be expressed as T×Po, and the amount of light reflected by the semitransparent glass plate (the amount of reflection light) can be expressed as R×Po. Also, as shown in FIG. 9, the semitransparent glass plate 22 is formed from a transparent substrate 22a and a dielectric multilayer film 22b formed on one surface of the transparent substrate 22a.

Figure 10:
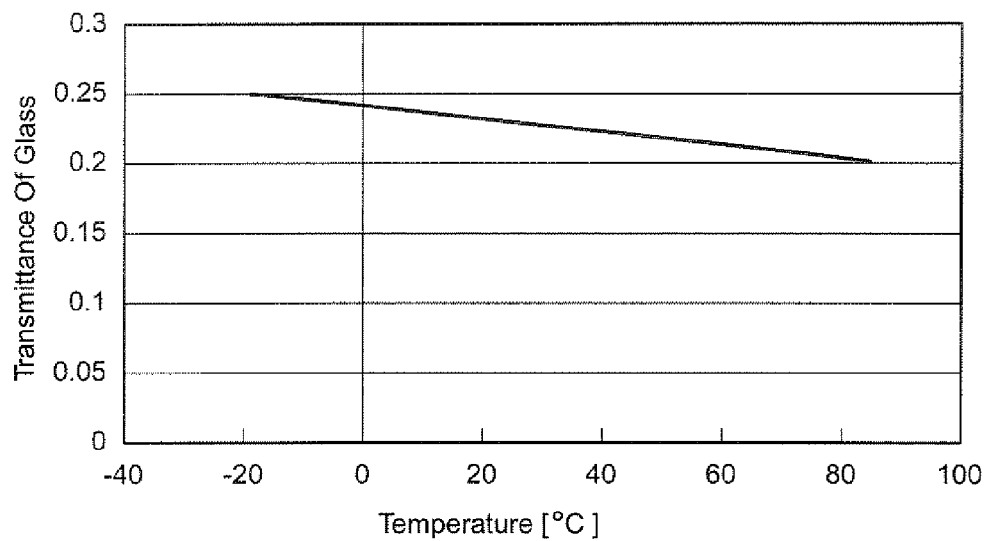
FIG. 10 is a graph showing an example of transmittance characteristic of a semitransparent glass plate in accordance with Embodiment 2.

FIG. 10 is a graph showing an example of transmittance characteristics of the semitransparent glass plate. In FIG. 10, temperatures (° C.) are indicated along the axis of abscissa, and transmittance values T of the semitransparent glass plate 22 are indicated along the axis of ordinate. As shown in FIG. 10, the semitransparent glass plate 22 of the present embodiment has a characteristic in which its transmittance T decreases with an increase (elevation) in the ambient temperature, in other words, has a negative temperature characteristic. Such a temperature characteristic can be obtained by an appropriate design of the structure of the dielectric multilayer film 22b described above. Alternatively, by appropriately adjusting the angle of the semitransparent glass plate 22 with respect to the optical axis, the temperature characteristic shown in FIG. 10 can be obtained.

Figure 11:
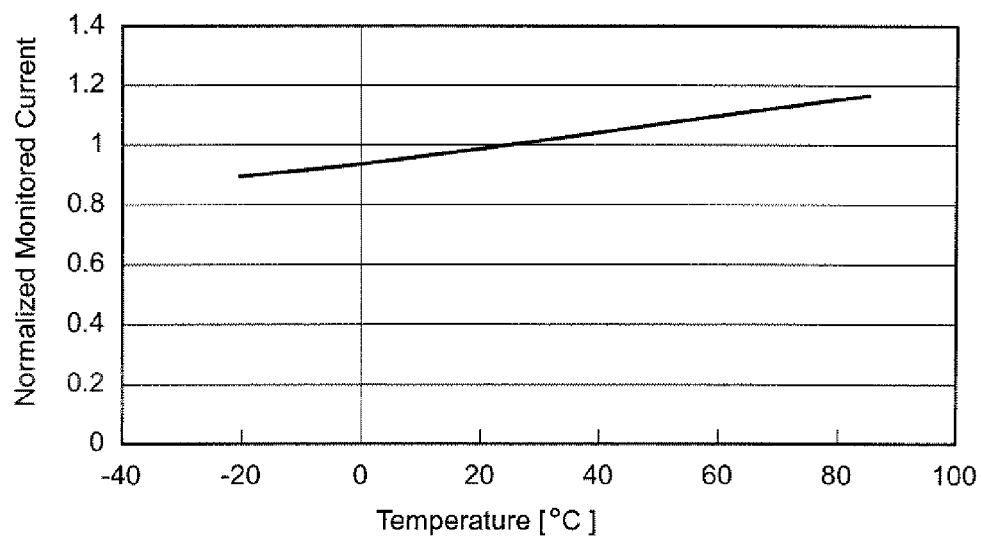
FIG. 11 is a graph showing a temperature characteristic of monitored currents of a monitoring light receiving element

FIG. 11 is a graph showing a temperature characteristic of monitored currents of the monitoring light receiving element. In the graph shown in FIG. 11, temperatures are indicated along the axis of abscissa, and monitored currents obtained when a constant amount of light is inputted in the monitoring light receiving element 20 are indicated along the axis of ordinate. It is noted that the monitored currents are normalized based on an output value at 25° C. If the amount of light emitted (light output) Po from the light emitting element 10 is constant, the amount of transmission light (T×Po) decreases and the amount of reflection light (R×Po) increases with an elevation of the ambient temperature, such that the amount of light incident upon the light receiving surface of the monitoring light receiving element 20 increases with an elevation of the ambient temperature. Accordingly, as shown in FIG. 11, the monitored current increases with an elevation of the ambient temperature. By this, the range of current values that can drive the light emitting element 10 in a certain temperature range becomes wider. In other words, the drivable temperature range of the light emitting element 10 becomes wider. However, when the optical module is driven in a manner that monitored currents are maintained at a constant value regardless of changes in the ambient temperature, the amount of emission light of the light emitting element 10 decreases with an elevation of the ambient temperature. For this reason, as described above in Embodiment 1 with reference to FIG. 5, the light output of the light emitting element 10 tends to lower with an elevation of the ambient temperature. In this respect, in the optical module in accordance with the present embodiment, the refractive index characteristic of the lens 16 is given temperature dependency, and a novel arrangement is implemented in the distance between the lens 16 and one end of the light emitting element 10, thereby avoiding a reduction in the optical coupling efficiency due to changes in the optical output of the light emitting element 10. The present embodiment is described below in greater detail with reference to FIG. 6 in Embodiment 1.

As described above, FIGS. 6A and 6B are views for describing the mutual distance between the lens and one end of the light emitting element. FIGS. 6A and 6B schematically illustrate a light beam (having an optical axis L) emitted from the light emitting element 10, passing through the lens 16 and reaching one end of the optical fiber 102. It this example, the lens 16 may be formed with resin, and has a characteristic to reduce its refractive index with an increase in the ambient temperature. More concretely, the lens 16 of the present embodiment has a refractive index of about 1.64 at 25° C., and has temperature dependency of $-1.9 \times 10^{-4}$ (1/° C.). FIG. 6A and FIG. 6B indicate a light beam in a solid line at an ambient temperature of 25° C., and a light beam in a dotted line at an ambient temperature of 85° C. It is noted that the upper limit of the range in which the optical module of the present embodiment can be operated (operation range) is 85° C.

FIG. 6A shows a case in which one end of the optical fiber 102 is disposed at a focal point of the lens 16 at an ambient temperature of 25° C. In this case, the optical coupling efficiency in coupling light to the optical fiber 102 at the ambient temperature of 25° C. (room temperature) becomes the highest, and when the ambient temperature is lower or higher than 25° C., the optical coupling efficiency becomes lower. This phenomenon is shown in a graph (Comparison Example) in FIG. 7. In contrast, FIG. 6B shows a case in which one end of the optical fiber 102 is disposed at a focal point of the lens 16 at an ambient temperature of 85° C. More specifically, the emission end of the light emitting element 10 is disposed at a position shifted in a direction along the optical axis L by a distance d away from its position at the ambient temperature of 25° C. In other words, the mutual distance between the light emitting element 10 and the lens 16 is set such that the focal position of the lens 16, when the ambient temperature is at a predetermined temperature (e.g., the upper limit of the operational range of the optical module in the present example, which is 85° C.) higher than 25° C. (room temperature), concurs with one end of the optical fiber 102. In this case, the optical coupling efficiency in coupling light to the optical fiber 102 at the ambient temperature of 85° C. is the highest, and the optical coupling efficiency lowers as the ambient temperature becomes lower than 85° C. It is noted that the emission end of the light emitting element 10 can be appropriately disposed anywhere between the position at the ambient temperature being 25° C. (shown in FIG. 6A) and the position at the ambient temperature being 85° C. (shown in FIG. 6B). In other words, in the case of the embodiment example described above, the distance d can be set in a range of $0 < d \leq 20$ μm.

In this manner, the refractive index of the lens 16 is provided with temperature dependency, and the mutual distance between the lens 16 and the light emitting element 10 is made greater, whereby positive temperature dependency can be given to the optical coupling efficiency in coupling light between the light emitting element 10 and the optical fiber 102. The optical coupling efficiency property having positive temperature dependency and the light output property of the light emitting element having negative temperature dependency described above (see FIG. 5) are superposed on each other, thereby creating the light output property of the optical module of the present embodiment. It is noted that the mutual distance between the lens 16 and the light emitting element 10 can be set to a predetermined value at the time of designing the connector part 101. Alternatively, the mutual distance between the light emitting element 10 and the lens 16 can be set to a predetermined value by using an optical fiber having a fiber core that protrudes by a specified length from an abutting face to which the ferrule mounted on the optical fiber 102 is abutted within the sleeve 18 at the time of core adjustment and assembly of the module.

According to Embodiment 2 described above, the drivable temperature range of an optical module can be widened without complicating the structure of the optical module. Also, by using the optical module described above, a high-performance optical communications device with a wide drivable temperature range can be obtained.

Embodiment 3

Next, an optical module in accordance with Embodiment 3 is described. The structure of the optical module in accordance with the present embodiment is generally the same as that of Embodiment 2 described above (see FIG. 1), and its illustration is therefore omitted. However, temperature characteristics of the monitoring light receiving element 20 and the semitransparent glass plate 22 are different from those of Embodiment 1, respectively. Their details are described below.

Figure 12:
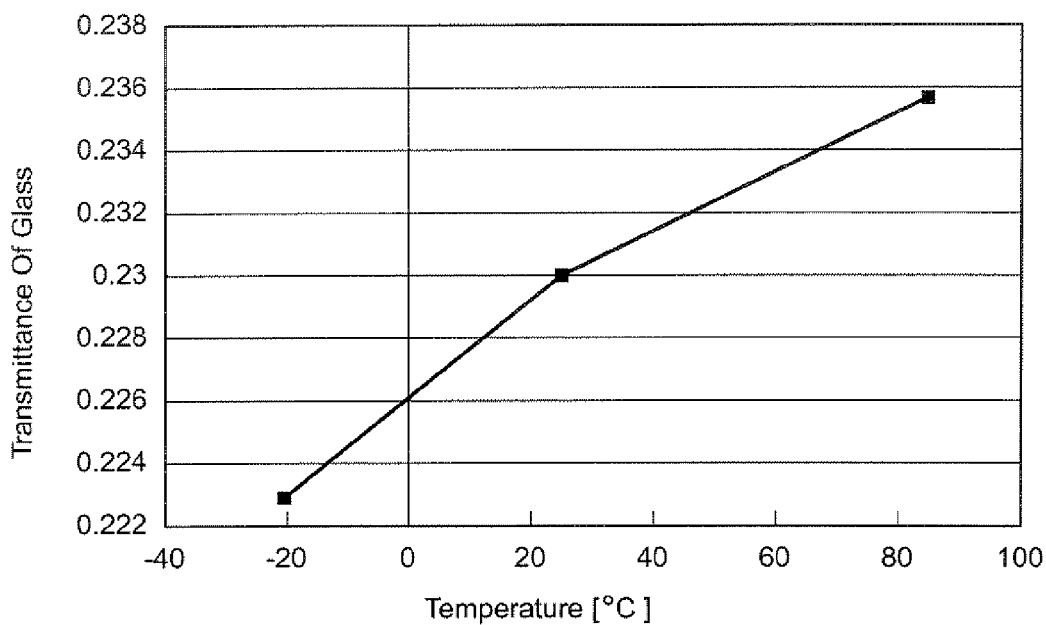
FIG. 12 is a graph showing an example of transmittance characteristic of a semitransparent glass plate in accordance with Embodiment 3.

FIG. 12 is a graph showing one example of transmittance characteristic of the semitransparent glass plate in accordance with the present embodiment. In FIG. 12, temperatures (° C.) are indicated along the axis of abscissas, and transmittances T of the semitransparent glass plate 22 are indicated along the axis of ordinate. As shown in FIG. 12, the semitransparent glass plate 22 of the present embodiment has a characteristic in which its transmittance T increases (reflectivity decreases) with an increase (elevation) in the ambient temperature, in other words, has a positive temperature characteristic. Such a temperature characteristic can be obtained through appropriately designing the structure of the dielectric multilayer film 22b described above (see FIG. 9).

Figure 13:
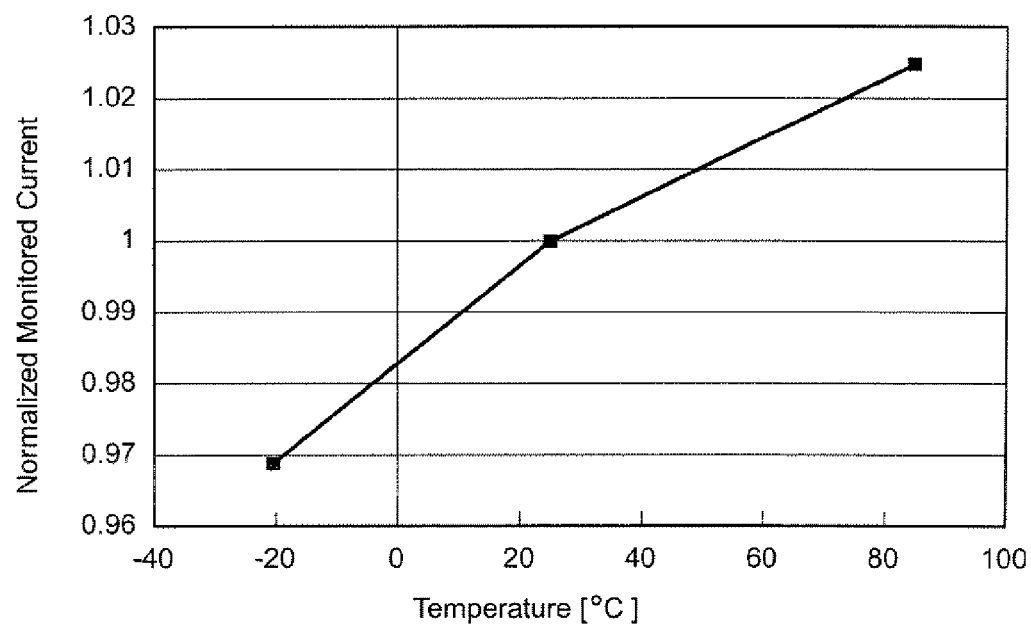
FIG. 13 is a graph showing a temperature characteristic of monitored currents of a monitoring light receiving element.

FIG. 13 is a graph showing a temperature characteristic of monitored currents of the monitoring light receiving element. In the graph shown in FIG. 13, temperatures are indicated along the axis of abscissa, and monitored currents obtained when a constant amount of light is made incident upon the monitoring light receiving element 20 are indicated along the axis of ordinate. It is noted that the monitored currents are normalized based on an output value at 25° C. The monitoring light receiving element 20 in accordance with the present embodiment has a characteristic in which its photosensitivity increases with an increase in the ambient temperature (in other words, has a positive temperature characteristic), More concretely, the monitoring light receiving element 20 in accordance with the present embodiment has a temperature coefficient of 0.2%/° C. with respect to light with a wavelength of 850 nm. Such a temperature characteristic may be realized, for example, when the monitoring light receiving element 20 is composed of a semiconductor element as described above, by increasing the amount of impurity (the amount of doping) added to an n-type region more than normal, making the thickness of a photoabsorption layer thinner than normal, adjusting the designed wavelength of a reflection prevention coating film, or the like. Accordingly, as shown in FIG. 13, the monitored current increases with an elevation of the ambient temperature. By this, the range of current values that can drive the light emitting element 10 in a certain temperature range is widened. In other words, the drivable temperature range of the light emitting element 10 is widened.

Figure 14:
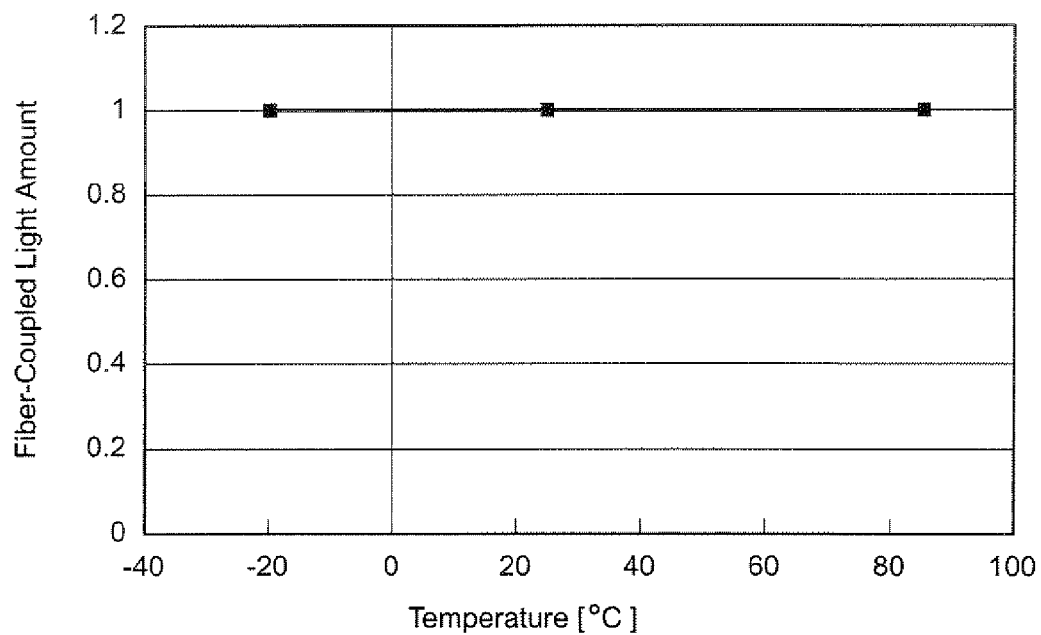
FIG. 14 is a graph showing a temperature characteristic of the amount of light coupled between a light emitting element and an optical fiber when the light emitting element is controllably driven such that the monitored current becomes constant.

FIG. 14 is a graph showing a temperature characteristic of the amount of coupled light between the light emitting element (VCSEL) and the optical fiber when the light emitting element is controllably driven in a manner that monitored currents are maintained constant. In the present embodiment, because the monitoring light receiving element 20 having a positive temperature characteristic is used (see FIG. 13), when the light emitting element 10 is driven in a manner that the monitored currents are maintained constant, the light output of the light emitting element 10 tends to lower with an elevation of the ambient temperature. On the other hand, because the semitransparent glass plate 22 has a positive temperature characteristic (see FIG. 12), the amount of transmission light (T×Po) increases and the amount of reflection light (R×Po) decreases with an elevation of the ambient temperature. As these characteristics are superposed on each other, their temperature dependencies are cancelled out, and the temperature characteristic of the amount of coupled light can be made to have almost no dependency on the ambient temperature, as shown in FIG. 14.

It is noted that, in accordance with the present embodiment, it is also possible to avoid a reduction in the optical coupling efficiency, which may be caused by a change in the optical output of the light emitting element 10, by providing the refractive index property of the lens 16 with temperature dependency, and making a novel arrangement on the mutual distance between the lens 16 and one end of the light emitting element 10. This method is generally the same as that of Embodiment 1 or Embodiment 2 described above, and description of its details is omitted (see FIG. 6).

According to the present embodiment described above, the drivable temperature range of an optical module can be widened without complicating the structure of the optical module. Also, by using the optical module described above, a high-performance optical communications device with a wide drivable temperature range can be obtained.

Also, in Embodiments 2 and 3 described above, a VCSEL is enumerated as an example of the light emitting element. However, the light emitting element in accordance with the invention is not limited to such a device. Furthermore, in the embodiments described above, a light emitting element of a can-sealed type is enumerated. However, the light emitting element in accordance with the invention is not limited to such a type, Also, in Embodiments 2 and 3 described above, the lens is formed in one piece with the connector part. However, the lens may be formed independently.

Embodiment 4

Figure 15:
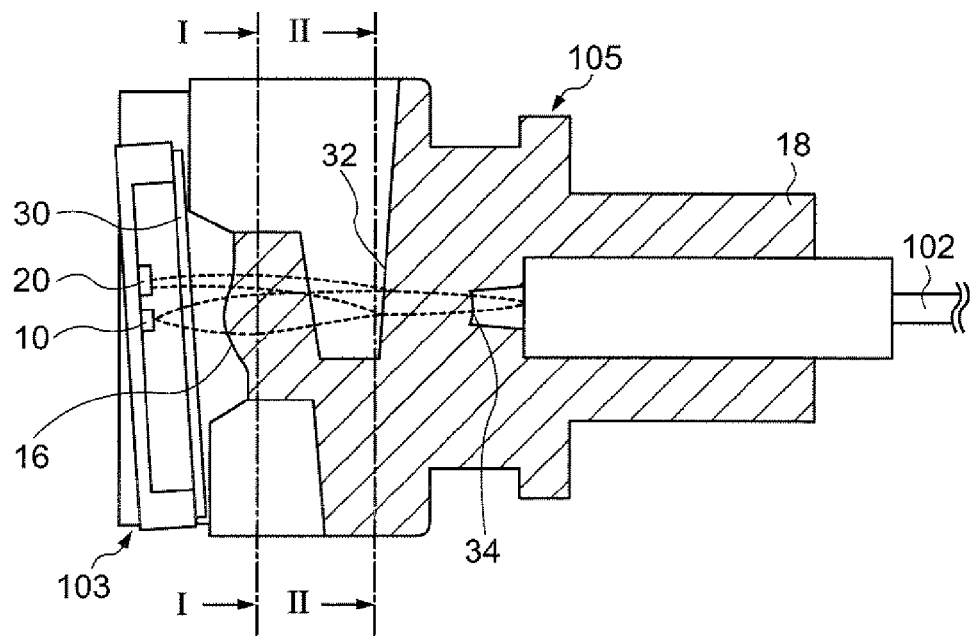
FIG. 15 is a cross-sectional view for describing a structure of an optical module in accordance with Embodiment 4.

FIGS. 15, 16A and 16B are cross-sectional views for describing a structure of an optical module in accordance with another embodiment of the invention. FIG. 16A corresponds to a I-I cross section of FIG. 15, and FIG. 16B corresponds to a II-II cross section of FIG. 15. The optical module in accordance with the present embodiment is formed from a ceramic package 103 and a connector part (supporting member) 105 positioned with each other, which are affixed with each other by using an adhesive not shown. The connector part 105 supports one end of an optical fiber 102, and optically couples the optical fiber 102 to a light emitting element 10 within the ceramic package 103.

The ceramic package 103 is formed from a housing made of ceramics or the like and a glass lid 30 that package the light emitting element 10. In the present embodiment, as the light emitting element 10, a VCSEL that emits light in multimode is considered. The light emitting element 10 emits light (a laser beam) with a wavelength of, for example, 850 nm. Also, the ceramic package 103 is equipped with a monitoring light receiving element 20 as a system for monitoring light output of the light emitting element 10. The monitoring light receiving element 20 is disposed at a location at which it can receive reflected light caused by a reflection surface 32 to be described below, and generates a current (hereafter referred to as a "monitored current") according to the amount of received light. The monitoring light receiving element 20 may be composed of a semiconductor element, such as, for example, a photodiode, a phototransistor, or the like.

The connector part 103 is equipped with a first lens 16 that is disposed with its optical axis matched with that of the light emitting element 10, and focuses light emitted from the light emitting element 10 and leads the light to one end of the optical fiber 102, and a sleeve section 18 with one end of the optical fiber 102 mounted and supported thereon. In the exemplary embodiment, a ferrule is mounted on one end of the optical fiber 102, and the ferrule is inserted in the sleeve section 18. It is noted that, in the exemplary embodiment, the optical fiber 102 is a GI (Graded Index) multimode fiber with an NA being 0.21, having, for example, a core diameter of 50 μm, and a clad diameter of 125 μm. In the present example, the connector part 103 is further equipped with a reflection surface 32 and a second lens 34 between the first lens 16 and the optical fiber 102. The reflection surface 32 has one surface that is placed diagonally with respect to (in other words, in a state not to be placed perpendicularly to) an optical axis of emission light of the light emitting element 10. The reflection surface 32 is coated on its surface with an extremely thin dielectric thin film, and reflects a part of components of emission light of the light emitting element 10. The connector part 103 may be formed with a resin member, and a recessed section having an inclined surface that traverses emission light of the light emitting element 10 may be formed in the resin member. The reflection surface 32 may be formed with, for example, the inclined surface. It is noted that the connector part 103 may have a structure that omits the second lens 34. Also, the reflection surface 32 may be formed with a member different from the lens (16 and 34).

Also in the present example, the monitoring light receiving element 20 may be provided with a characteristic in which its photosensitivity increases with an increase in the ambient temperature (in other words, a positive temperature characteristic), whereby the drivable temperature range of the light emitting element 10 can be widened, as described in Embodiment 1 with reference to FIG. 2 through FIG. 4. The characteristic described above can be obtained by providing the monitoring light receiving element 20 with, for example, a temperature coefficient of 0.2%/° C. with respect to light with a wavelength of 850 nm. Such a temperature characteristic may be realized, for example, when the monitoring light receiving element 20 is composed of a semiconductor element, by increasing the amount of impurity (the amount of doping) added to an n-type region more than normal, making the thickness of a photoabsorption layer thinner than normal, adjusting the designed wavelength of a reflection prevention coating film, or the like.

Also in the present example, by providing the refractive index property of the first lens 16 with temperature dependency, and making a novel arrangement on the mutual distance (positioning) between the first lens 16 and one end of the light emitting element 10, a reduction in the optical coupling efficiency, which may be caused by a reduction in the optical output of the light emitting element 10 occurring with an elevation of the ambient temperature, can be suppressed.

In other words, as described above in Embodiment 1 with reference to FIG. 5, the optical output of the light emitting element 10 tends to lower with an elevation of the ambient temperature. In other words, the optical output of the light emitting element under the condition described above has negative temperature dependency.

However, as described above in Embodiment 1 with reference to FIGS. 6A and 6B, when the first lens 16 is positioned such that a focal point of the first lens 16 concurs with one end of the optical fiber 102 at an ambient temperature of 25° C. (see FIG. 6A), the optical coupling efficiency in coupling light to the optical fiber 102 at the ambient temperature of 25° C. (room temperature) becomes the highest, and when the ambient temperature is lower or higher than 25° C., the optical coupling efficiency becomes lower (see the "comparison example" in FIG. 7).

In contrast, when the first lens 16 is positioned such that a focal point of the first lens 16 concurs with one end of the optical fiber 102 at an ambient temperature of 85° C., more concretely, when the emission end of the light emitting element 10 is disposed at a position shifted in a direction along the optical axis L by a distance d away from its position at the ambient temperature of 25° C., the optical coupling efficiency in coupling light to the optical fiber 102 at the ambient temperature of 85° C. becomes the highest, and the optical coupling efficiency lowers as the ambient temperature becomes lower than 85° C. (see the "embodiment example" in FIG. 7). In the present example also, the distance d can be set in a range of $0 < d \leq 20$ μm.

It is noted that the mutual distance between the first lens 16 and the light emitting element 10 can be set to a predetermined value at the time of designing the connector part 101, as described in Embodiment 1. Alternatively, the mutual distance between the light emitting element 10 and the first lens 16 can be set to a predetermined value by using an optical fiber having a fiber core that protrudes by a specified length from an abutting face to which the ferrule mounted on the optical fiber 102 is abutted within the sleeve 18 at the time of core adjustment and assembly of the module.

At the time of assembly (alignment) of the optical module, for example, (1) the ceramic package 103 and the connector part 105 may be connected (temporarily affixed) with each other, and then the light emitting element 10 may be made to emit light, and the optical fiber 102 may be positioned at a focal point of the light. (2) Then, the ceramic package 103 may be retreated, and the ceramic package 103 and the connector part 105 may be sealed at a position where the distance between the light emitting element 10 and the first lens 16 is changed by a distance d. It is noted that the distance d may be a distance obtained by simulation made in consideration of the temperature dependency of the refractive index of the first lens 16, the distance between the light emitting element 20 and the first lens 16 and the like, or the ambient temperature may be actually adjusted to 85° C., and the distance may be adjusted such that a focal point of the first lens 16 matches with the optical fiber 102. By this adjustment, an input side distance between an end section of the light emitting element 10 and an input side main plane of the first lens 16, and an output side distance between an output side main plane of the first lens 16 and an end section of the optical fiber 102 can be determined. In this manner, by utilizing physical property values such as changes in refractive index of the resin by temperature changes and the like, the focal point can be readily changed. It is noted that, when the second lens 34 is used, the distance d needs also to be decided in consideration of the temperature dependency of the refractive index of the second lens 34.

As a result, when the optical module of the exemplary embodiment is driven, the optical coupling efficiency in coupling light to the optical fiber 102 at an ambient temperature of 85° C. becomes the highest, and the optical coupling efficiency lowers as the ambient temperature lowers below 85° C. (see FIG. 6B). More concretely, as shown in FIG. 17, as the ambient temperature increases, the refractive index of the first lens 16 gradually becomes smaller from θ1, to θ2, and to θ3, and the focal point moves closer to the end section of the optical fiber 102 from F1, to F2 and to F3. In other words, as the ambient temperature elevates from the first temperature to the second temperature, the focal point moves closer to the end section of the optical fiber 102. FIG. 17 is a schematic diagram that shows in exaggeration the relation between the ambient temperature and the focal point at the time of driving.

In this manner, by providing the refractive index of the first lens 16 with temperature dependency and making the mutual distance between the first lens 16 and the light emitting element 10 greater, the optical coupling efficiency in coupling light between the light emitting element 10 and the optical fiber 102 can have positive temperature dependency (see FIG. 7). The optical coupling efficiency property having positive temperature dependency and the light output property of the light emitting element having the negative temperature dependency described above (see FIG. 5) are superposed on each other, which creates the optical output characteristic of the optical module.

Accordingly, also in accordance with the present example, changes in the light output with changes in the ambient temperature can be suppressed, like Embodiment 1 (FIG. 8).

According to the embodiment described above, the drivable temperature range of an optical module can be widened without complicating its structure, like Embodiment 1. Also, a high-performance optical communications device with a wide drivable temperature range can be obtained by using the optical module described above.

Also, in accordance with the exemplary embodiment, the reflection surface 32 can be disposed between the first lens 16 and the optical fiber 102, in other words, an ample distance can be secured between the light emitting element 10 and the reflection surface 32, and the distance between the light emitting element 10 and the monitoring light receiving element 20 can be made greater. In other words, the degree of freedom in layout of the light emitting element 10 and the monitoring light receiving element 20 improves. Also, the monitoring light receiving element 20 can be made larger, such that the light receiving efficiency can be improved. Also, because the second lens 34 is provided, the distance between the lens (16, 34) and the optical fiber 102 can be made smaller. Furthermore, the first lens 16, the second lens 34 and the reflection surface 32 can be formed in one piece with resin or the like, such that the number of components can be reduced.

Also, the reflection surface 32 of the optical module of the present embodiment may be provided with the function of the semitransparent glass plate 22 described in detail in Embodiment 2. In other words, as described above in Embodiment 2 with reference to FIG. 9, when the transmittance (power transmittance) of the reflection surface 32 is T, the reflectivity (power reflectivity) thereof is R, and absorption by the reflection surface 32 is ignored, a relation T=1−R is established. When the amount of light emitted from the light emitting element 10 is Po, the amount of light transmitting the reflection surface 32 (the amount of transmission light) can be expressed as T×Po, and the amount of light reflected by the reflection surface 32 (the amount of reflection light) can be expressed as R×Po. The reflection surface 32 may be formed by vacuum depositing a dielectric multilayer film on the inclined surface of the connector part 105, or adhering an independent reflection plate to the inclined surface.

The reflection surface 32 may be provided with characteristic in which the transmittance T decreases with an increase (elevation) in the ambient temperature, in other words, a negative temperature characteristic, as described in Embodiment 2 with reference to FIG. 10. Such a temperature characteristic can be obtained by appropriately designing the structure of the dielectric multilayer film described above. Alternatively, the temperature characteristic can be obtained by appropriately adjusting the angle of the reflection surface 32 with respect to the optical axis.

In this case, the monitored current increases with an elevation of the ambient temperature, as described in detail in Embodiment 2 with reference to FIG. 11. By this, the width of drivable current values of the light emitting element 10 in a certain temperature range is widened. In other words, the drivable temperature range of the light emitting element 10 is widened. However, when the optical module is driven in a manner that monitored currents are maintained at a constant value regardless of changes in the ambient temperature, the amount of emission light of the light emitting element 10 decreases with an elevation of the ambient temperature. For this reason, as described in Embodiment 1 with reference to FIG. 5, the light output of the light emitting element 10 tends to lower with an elevation of the ambient temperature. In this respect, as described above with reference to FIG. 6 and FIG. 17, the refractive index characteristic of the lens 16 is provided with temperature dependency, and the novel arrangement is implemented in the distance between the lens 16 and one end of the light emitting element 10, whereby a reduction in the optical coupling efficiency due to changes in the optical output of the light emitting element 10 can be avoided.

Also, the reflection surface 32 of the optical module in accordance with the present embodiment may be provided with the function of the semitransparent glass plate 22 described in Embodiment 3. In other words, as described in Embodiment 3 with reference to FIG. 12, the reflection surface 32 may have a characteristic in which the transmittance T increases with an increase (elevation) in the ambient temperature, in other words, a positive temperature characteristic. Such a temperature characteristic can be obtained by appropriately designing the structure of the dielectric multilayer film 22b described above (see FIG. 9).

In this case, even when the reflectivity reduces, the monitored current can be increased with an elevation of the ambient temperature by providing the monitoring light receiving element 20 with a characteristic in which the photosensitivity increases with an increase in the ambient temperature, as described in Embodiment 3 with reference to FIG. 13. By this, the range of drivable current values of the light emitting element 10 is widened in a certain temperature range. In other words, the drivable temperature range of the light emitting element 10 is widened.

When the monitoring light receiving element 20 having a positive temperature characteristic is used, the light output of the light emitting element 10 tends to lower with an elevation of the ambient temperature, when the light emitting element 10 is driven in a manner that monitored currents are maintained constant. On the other hand, as the reflection surface 32 has a positive temperature characteristic (see FIG. 12), the amount of transmission light (T×Po) increases and the amount of reflection light (R×Po) decreases with an elevation of the ambient temperature. Accordingly, these characteristics are superposed on each other, such that the temperature dependencies are cancelled out, and the temperature characteristic in the amount of coupled light is made to have almost no dependency on the ambient temperature.

Also in this case, as described above with reference to FIGS. 6A and 6B and FIG. 7, by providing temperature dependency on the refractive index property of the first lens 16, and making a novel arrangement on the mutual distance between the first lens 16 and one end of the light emitting element 10, a reduction in the optical coupling efficiency, which may be caused by a change in the optical output of the light emitting element 10, can be suppressed.

According to the embodiment described above, the drivable temperature range of an optical module can be widened without complicating the structure of the optical module. Also, by using the optical module described above, a high-performance optical communications device with a wide drivable temperature range can be obtained.

Also, in the embodiment described above, a VCSEL is enumerated as an example of the light emitting element. However, the light emitting element in accordance with the invention is not limited to such a device. Furthermore, although in the embodiment described above, a light emitting element of a ceramic-sealed type is enumerated, the light emitting element in accordance with the invention is not limited to such a type.

Also, in the embodiment described above, the lens is formed in one piece with the connector part. However, the lens may be formed independently.

It is noted that the invention is not limited to Embodiments 1-4 described above, and many changes can be made within the scope of the subject matter of the invention. For example, the embodiment examples described with concrete numerical values in the above-described embodiments are simply examples, and do not limit the applicable range of the invention. Also, the structures described above in the form of embodiments may be appropriately combined for specific purposes, or may be used with changes or improvements added thereto.

What is claimed is:

1. An optical module comprising:
   a light emitting element;
   a connector part that supports one end of an optical fiber and optically couples the optical fiber to the light emitting element;
   a monitoring light-receiving element that has a characteristic to increase photosensitivity with an increase in an ambient temperature, and receives a part of components of light emitted from the light emitting element; and a lens that has a characteristic to reduce a refractive index with an increase in an ambient temperature, and is disposed between the light emitting element and a semitransparent plate that is disposed between the light emitting element and the connector part, wherein a mutual distance between the light emitting element and the lens is set such that a focal position of the lens, when the ambient temperature is a predetermined temperature higher than room temperature, concurs with one end of the optical fiber.

2. An optical module according to claim 1, wherein the monitoring light-receiving element receives reflected light from the semitrasparent plate as the part of components of light.

3. An optical module according to claim 1, wherein the predetermined temperature higher than room temperature is an upper limit of an operational range of the optical module.

4. An optical communications device comprising the optical module recited in claim 1.

5. An optical module comprising:
a light emitting element having an end face that emits a laser beam;
a lens that focuses the laser beam to a focal point and has an input side main plane and an output side main plane;
an optical fiber that has an end section for receiving the laser beam focused by the lens and outputs the laser beam received outside the optical module; and
a supporting member that supports the light emitting element, the lens optical fiber, and secures an input side distance between the end section of the light emitting element and the input side main plane of the lens and an output side distance between the output side main plane of the lens and the optical fiber,
wherein the supporting member positions a focal point of the lens to a first position that is spaced a distance from the end face of the optical fiber when the optical module is at a first temperature, and positions the focal point of the lens to a second position that is closer to the end face of the optical fiber than the first position when the optical module is at a second temperature higher than the first temperature; and
wherein a refractive index of the lens is smaller at the second temperature than at the first temperature.

6. An optical module according to claim 5, wherein the distance between the output side main plane of the lens and the second position is greater than the distance between the output side main plane of the lens and the first position.

7. An optical module comprising:
a light emitting element;
a connector part that supports one end of an optical fiber and optically couples the optical fiber to the light emitting element;
a semitransparent plate that has a characteristic to change reflectivity with an increase in an ambient temperature, and is disposed between the light emitting element and the connector part;
a monitoring light receiving element that receives reflected light reflected by the semitransparent plate; and
a lens that has a characteristic to reduce refractive index with an increase in the ambient temperature, and is disposed between the light emitting element and the semitransparent plate, wherein a mutual distance between the light emitting element and the lens is set such that a focal position of the lens, when the ambient temperature is a predetermined temperature higher than room temperature concurs with one end of the optical fiber
wherein the semitransparent plate that has a characteristic to increase reflectivity with an increase in an ambient temperature.

8. An optical module according to claim 7, wherein the semitransparent plate that has a characteristic to decrease reflectivity with an increase in an ambient temperature.

9. An optical module according to claim 7, wherein the semitransparent plate includes a transparent substrate and a dielectric multilayered film formed on one surface of the transparent substrate.

10. An optical module according to claim 8, wherein the semitransparent plate includes a transparent substrate and a dielectric multilayered film formed on one surface of the transparent substrate.

11. An optical module according to claim 8, further comprising a lens that has a characteristic to reduce refractive index with an increase in the ambient temperature, and is disposed between the light emitting element and the semitransparent plate, wherein a mutual distance between the light emitting element and the lens is set such that a focal position of the lens, when the ambient temperature is a predetermined temperature higher than room temperature, concurs with one end of the optical fiber.

12. An optical module according to claim 7, wherein the predetermined temperature higher than room temperature is an upper limit of an operational range of the optical module.

13. An optical module according to claim 11, wherein the predetermined temperature higher than room temperature is an upper limit of an operational range of the optical module.

* * * * *

UNITED STATES PATENT AND TRADEMARK OFFICE
CERTIFICATE OF CORRECTION

| | | |
|---|---|---|
| PATENT NO. | : 7,439,533 B2 | Page 1 of 1 |
| APPLICATION NO. | : 11/551742 | |
| DATED | : October 21, 2008 | |
| INVENTOR(S) | : Satoshi Kito, Akira Miyamae and Kimio Nagasaka | |

It is certified that error appears in the above-identified patent and that said Letters Patent is hereby corrected as shown below:

On the Title Page, Item (30) Foreign Application Priority Data, above Line 1, insert the following:
--Nov. 16, 2005   (JP)   ...........2005-331985-- and
--Nov. 16, 2005   (JP)   ..........2005-331989--

Column 1, Line 27:     "laps" should be --lapse--

Column 2, Line 17:     "itself" should be --itself,--

Column 4, Line 66:     "above" should be --above.--

Column 5, Line 41:     "element" should be --element.--

Column 8, Line 6:      "It" should be --In--

Column 11, Line 34:    "It" should be --In--

Column 13, Line 67:    "type," should be --type.--

Column 19, Line 31, Claim 5: after "lens" insert --and the--

Signed and Sealed this

Thirty-first Day of March, 2009

JOHN DOLL
*Acting Director of the United States Patent and Trademark Office*